United States Patent
Weimer et al.

(10) Patent No.: US 11,716,867 B1
(45) Date of Patent: Aug. 1, 2023

(54) CONTROLLED METHOD TO SPONTANEOUSLY SELF-ASSEMBLE UNIFORM, WELL-ORDERED FILMS OF SOLID NANOPARTICLES

(71) Applicants: Jeffrey J. Weimer, Huntsville, AL (US); Cuong Nguyen, Huntsville, AL (US)

(72) Inventors: Jeffrey J. Weimer, Huntsville, AL (US); Cuong Nguyen, Huntsville, AL (US)

(73) Assignee: Board of Trustees of the University of Alabama, for and on behalf of the University of Alabama in Huntsville, Huntsville, AL (US)

( * ) Notice: Subject to any disclaimer, the term of this patent is extended or adjusted under 35 U.S.C. 154(b) by 271 days.

(21) Appl. No.: 17/032,880

(22) Filed: Sep. 25, 2020

Related U.S. Application Data (60) Provisional application No. 62/905,868, filed on Sep. 25, 2019.

(51) Int. Cl.
| | | |
|---|---|---|
| H01L 51/50 | (2006.01) |
| H10K 50/115 | (2023.01) |
| B05D 1/20 | (2006.01) |
| C09K 11/06 | (2006.01) |
| B22F 1/0545 | (2022.01) |

(52) U.S. Cl.
CPC ........... *H10K 50/115* (2023.02); *B05D 1/204* (2013.01); *B22F 1/0545* (2022.01); *C09K 11/06* (2013.01)

(58) Field of Classification Search
CPC ..... H01L 51/502; B05D 1/204; B22F 1/0545; C09K 11/06
See application file for complete search history.

(56) References Cited

U.S. PATENT DOCUMENTS

| | | | |
|---|---|---|---|
| 9,096,425 B2 | 8/2015 | Coe-Sullivan | |
| 2017/0194144 A1* | 7/2017 | Duan | H01L 21/02601 |
| 2018/0229262 A1* | 8/2018 | Asbahi | B05D 1/18 |

FOREIGN PATENT DOCUMENTS

| | | | | |
|---|---|---|---|---|
| WO | WO-2017018946 A1 * | 2/2017 | | B05D 1/18 |

OTHER PUBLICATIONS

Cadmium selentide, PubChem, 2005.
(Continued)

*Primary Examiner* — Donald L Raleigh
(74) *Attorney, Agent, or Firm* — Maynard Nexsen PC; Brian T. Sattizahn (57) ABSTRACT

The present disclosure generally pertains to methods of preparing a well-ordered nanoparticle coating on a substrate. A nanoparticle solution having nanoparticles in a solvent is deposited on a sub-phase of a denser, immiscible liquid. A constrained area on the top surface of the sub-phase is provided, where nanoparticle solution spreading is physically limited and the nanoparticles spontaneously form a uniformly ordered monolayer on the sub-phase within the constrained area. Notably, no compression of the nanoparticle film occurs after the spreading phase in order to form the monolayer. After the monolayer is formed, a substrate is placed into contact with the monolayer and coated with a well-ordered nanoparticle coating.

19 Claims, 6 Drawing Sheets

(56) References Cited

OTHER PUBLICATIONS

Hu, et al., Oil-water interfacial self-assembly: a novel strategy for nanofilm and nanodevice fabrication, 2012, Chemical Society, Rev. 2012, 41, 1350-1362, 2012.
Vapour Pressure, ScienceDirect, 2017.
Guo, et al., Supporting Information of Self-Assembled Large-Scale Monolayer of Au Nanoparticles at the Air/Water Interface Used as a SERS Substrate, American Chemical Society, Langmuir 2016, 32, 4530-4537. DOI: 10,1021/acs.langmuir,5b04393, 2016.
Guo, et al., Self-Assembled Large-Scale Monolayer of Au Nanoparticles at the Air/Water Interface Used as a SERS Substrate, The Supporting Information is available free of charge on the ACS Publications website at DOI: 10,102,5b04393, 2016.
Weimer, et al., U.S. Appl. No. 17/225,040 entitles, Systems and Methods for Forming Uniform Monolayers of Nanoparticles, filed Apr. 7, 2021.

* cited by examiner

CONTROLLED METHOD TO SPONTANEOUSLY SELF-ASSEMBLE UNIFORM, WELL-ORDERED FILMS OF SOLID NANOPARTICLES

RELATED APPLICATION

This application claims priority to U.S. Provisional Patent Application No. 62/905,868 filed on Sep. 25, 2019, titled "Controlled Method to Spontaneously Self-Assemble Uniform, Well-Ordered Films of Solid Nanoparticles," the entire contents of which are incorporated herein.

TECHNICAL FIELD

The present disclosure is directed to methods of preparing well-ordered nanoparticle coatings on a substrate.

RELATED ART

Coatings of nano- to micro-sized particles (hereafter called NPs) are used to create thin layers with a specific function on top of a bulk material. For instance, coating a rigid substrate with a layer or layers of NPs can change wetting, optical-reflectivity, or chemical reactivity of the substrate from an undesired to a desired performance standard while retaining the structural integrity of the bulk substrate. Effective methods to change the properties of the coating as suitable for its application include varying the composition and size of the NPs, changing the chemistry on the surface of the NPs, and varying the structural packing arrangements of the NPs within the coating. Quantum dots (QDs) are a specific class of NPs with characteristic optoelectronic properties, important for example to convert light to electrical current flow. Coatings of QDs are used in applications such as the production of solar cells and electronic light-emitting displays.

The ability to coat substrates with a layer or multilayers of NPs that are structurally well-ordered at nano-scale levels over ranges of macro-scale in length is of particular interest in applications involving devices with surface properties that must be controlled at the nano- to micro-scale and maintained over large surface areas. In these applications, non-uniformity of packing order at the nano-scale may have a profound impact on device or component performance because the defects in structural order are the same size as the required performance metric, while the lack of uniformity in the nano-scale ordering over the macro-scale can impede the ability to produce large area devices. These limitations apply for example for coatings of QDs on solar cells or electronic computer-display monitors. In such cases, the most desirable coating is typically a single layer that is homogenous in its structure and thickness at the nano-scale while being contiguous in structural order and uniform in thickness over macro-scales across the entire coated region of the system. Such ideal monolayers require less material to be coated on a substrate to achieve the desired performance metrics of the component or device and thereby may serve to reduce material waste.

One common method of preparing coatings of NPs on a substrate is spin coating, where a solution containing the NPs is applied to the center of a substrate that is spinning or is spun so that, by centrifugal force, the solution spreads across the substrate. While it is a readily-applied method, spin coating, however, restricts the size and shape of the substrate which may be coated. For instance, a non-radially symmetrical substrate may not typically be evenly balanced and could result in an uneven, non-uniform coating. The substrate must also fit within the confines of the spin coater. Finally, the two most important issues associated with spin coating are that it wastes the NPs from the solution as it moves past the edges of the spinning substrate and that it cannot produce well-ordered monolayers of NPs when this level of homogeneity in structure and thickness is required.

Other methods to prepare nanoparticle coatings include drop casting, dip coating, and spray or electrospray coating. Drop casting deposits a solution of the NPs on the substrate and allows the drop to dry. Dip coating immerses the substrate in the solution, removes it, and allows the film to dry. Finally, in spray/electrospray coating, a solution of the neutrally-charged or ionized NPs is sprayed as an aerosol over the substrate and the film is allowed to dry. All of these other methods have their own practical issues during application. None of them are able to produce well-ordered monolayers of NPs when this level of homogeneity in structure and thickness is required.

The above summaries illustrate the practical difficulties that arise to form well-structured, uniform monolayer coatings of NPs on substrates of varied sizes and shapes using conventional coating methods. Such well-ordered coatings require a higher degree of control in the deposition step than can be afforded by spin coating, drop casting, dip coating, or spray/electrospray coating to assure the formation of a homogenous and uniform monolayer coating.

One method to produce well-ordered monolayer films of molecules across large spatial areas of a surface follows a sequence of steps called Langmuir deposition. The first step is to create a floating monolayer of molecules on a liquid subphase. The floating film is called a Langmuir film, and the most common molecular systems for Langmuir films are oils or fatty acids floating on water. Certain classes of molecules can self-assemble during the deposition step to form ordered structures at the nano- and micro-scale. More often though, the initially unconstrained Langmuir film must be compressed to induce self-assembly of the molecules. Compression is applied by reducing the containment area of the film using moveable barriers. This forces the molecules together into various ordered structures, eventually resulting in a well-organized, close-packed monolayer over a confined area. Sometimes, a sequence of compression+expansion cycles must be repeated to anneal out nano-scale defects in the Langmuir film or to smooth out the structure in the Langmuir film across larger spatial regions. Compression of the initial Langmuir film is followed by dipping a solid vertically through the Langmuir film (Langmuir Blodgett LB) or stamping a solid horizontally onto the Langmuir film (Langmuir Schaeffer LS) to transfer the well-ordered Langmuir film onto a solid substrate surface as a single monolayer or as multiple-monolayers.

Langmuir deposition methods have been successfully utilized to produce films of NPs. However, the production of a spontaneously self-assembled, well-ordered Langmuir monolayer of NPs extending over a large spatial region has not yet been established under any non-compressive methods. The production of such films always requires compression of the Langmuir film after the initial deposition step. In some cases, the Langmuir film of NPs must be cycled through compression and expansion more than one time to obtain a final, well-ordered structure.

The following method presents conditions required to create a Langmuir film of NPs where the NPs spontaneously self-assemble to form a well-structured monolayer across a large spatial region. Spontaneous self-assembly of NPs is driven by forces that occur within and during the spreading phase of the Langmuir film. This spontaneous self-assembly process by-passes the need to reach the same ordered state of NPs using external, mechanical means to compress the final Langmuir film after it has completely spread and before subsequent templating in accordance with LB or LS techniques. The initial, high-quality Langmuir film of NPs is formed without the use of post-compression, has a single micro-structure throughout the entire macro-layer of the film, and can be used directly to coat substrates with well-ordered coatings of NPs, including QDs.

SUMMARY OF THE DISCLOSURE

The present disclosure is directed to methods of forming well-ordered nanoparticle films on the surface of a substrate. In one aspect of the disclosure, there is provided a method of preparing a well-ordered nanoparticle coating on a substrate. The method involves first providing a nanoparticle solution of nanoparticles in a solvent. A volume of the nanoparticle solution is then deposited onto a top surface of a sub-phase of a denser, immiscible liquid within a vessel. A constrained area is provided on the top surface of the sub-phase, where nanoparticle solution spreading is physically limited within the constrained area. Nanoparticles spontaneously form a uniformly ordered monolayer on the sub-phase within the constrained area during the spreading phase, and no compression of the film occurs after the spreading phase. Finally, the substrate is placed into contact with the nanoparticle monolayer so that the substrate is coated with the well-ordered nanoparticle coating.

In some embodiments, the nanoparticles are quantum dots. In some instances, the quantum dots include a gradient core with oleic acid. In some instances, the nanoparticles have a radius of approximately 3 nm to approximately 4 nm, and in other instances, the nanoparticles are coated with ligands. In certain embodiments, the solvent is toluene and the sub-phase is water. In certain embodiments where the nanoparticles have a ligand coating, a pH of the sub-phase is slightly less than a pKa of ligands coated on the nanoparticles. In some embodiments, the sub-phase is contained in a static state. In this case, in some instances the depositing of the volume of nanoparticle solution on the top surface occurs by contacting the volume of nanoparticle solution directly with the top surface, while in other instances, the depositing of the volume of nanoparticle solution on the top surface occurs by dropping the volume of nanoparticle solution from a height above the top surface. In some embodiments, the sub-phase is contained within a channel in a flowing state. In this case, depositing of the volume of nanoparticle solution on the top surface occurs by including the volume of nanoparticle solution in the channels as layers or droplets that are immiscible with the sub-phase. In some instances, the substrate is contacted with the nanoparticle monolayer using a Langmuir Blodgett technique, while in other instances the substrate is contacted with the nanoparticle monolayer using a Langmuir Schaefer technique.

In another aspect of the disclosure, there is provided a method of preparing a well-ordered nanoparticle coating on a substrate. The method involves first providing a nanoparticle solution including an initial concentration of nanoparticles in a solvent. A volume of the nanoparticle solution is deposited onto the top surface of a sub-phase of a denser, immiscible liquid in a vessel, so that a nanoparticle film is formed. The nanoparticle film is evaluated for the formation of agglomerates. When agglomerates are observed, the previous steps are repeated with the initial concentration of nanoparticles in the solvent being decreased. The nanoparticle film is then monitored for the formation of a coffee ring pattern. If the coffee ring pattern begins to form, an initial coffee ring pattern area is measured. Then, the previous steps are repeated with a constrained area equal to the measured initial coffee ring pattern area, so that the spreading of nanoparticle solution is physically limited by the constrained area. Thus, the nanoparticles spontaneously form a uniformly ordered monolayer on the sub-phase within the constrained area during the spreading phase, and no compression of the film occurs after the spreading phase. The substrate is then placed into contact with the nanoparticle monolayer so that the substrate is coated with a well-ordered nanoparticle coating.

In some embodiments, the nanoparticles are quantum dots. In some embodiments, the nanoparticles are coated with ligands and a pH of the sub-phase is slightly less than a pKa of the ligands coated on the nanoparticles.

In yet another aspect of the disclosure, there is provided a method of preparing a well-ordered nanoparticle coating on a substrate. The method involves first providing a nanoparticle solution with nanoparticles in a solvent. A volume of the nanoparticle solution is deposited onto a top surface of a sub-phase of a denser, immiscible liquid within a vessel. A constrained area is then provided on the top surface of the sub-phase, where spreading forces of the nanoparticle solution are balanced by capillary forces that draw nanoparticles together as the solvent evaporates. Thus, the volume of nanoparticle solution disperses spontaneously across the area to form a uniform nanoparticle monolayer across the constrained area. The substrate is then placed into contact with the nanoparticle monolayer so that the substrate is coated with a well-ordered nanoparticle coating. In some instances, the nanoparticles are coated with ligands and a pH of the sub-phase is slightly less than a pKa of the ligands coated on the nanoparticles.

A further understanding of the nature and advantages of the present invention will be realized by reference to the remaining portions of the specification and the drawings.

BRIEF DESCRIPTION OF DRAWINGS

The present disclosure can be better understood, by way of example only, with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to methods for creating well-ordered coatings of nanoparticles (NPs) on a substrate, where the coating comprises a monolayer or well-defined multilayers that have a homogenous structure and consistent thickness throughout. Specifically, the present methods involve preparing a Langmuir film as a constrained, spontaneous self-assembly of NPs prior to utilizing LB or LS methods to coat the substrate.

Nanoparticles as presented in this disclosure are considered as particles with at least one dimension between one nanometer and potentially as high as tens of microns. They may be carbon-based or composed of materials including metals, ceramics, semiconductors, polymers, or biological materials such as lipids. Examples of NPs include liposomes; fullerenes; carbon nanotubes; dendrimers; semiconductor quantum dots; gold, silver, iron, or platinum colloidal particles; and silica colloids. Spherical QDs with a radius of 6-10 nanometers are used in the present method as exemplary NPs, though the exemplary method presented in this disclosure is compatible with other types, sizes, and shapes of NPs, which are thus contemplated for use herein.

The following methods to create well-ordered coatings of NPs on substrates provide an efficient and easily-adapted means of controlling the uniformity and organization of the nanoparticle coatings at a macro and micro-scale. These methods integrate new techniques of preparing spontaneously self-assembled Langmuir films of NPs with established LB and LS coating techniques. A goal of the following methods is to provide an initial, well-structured Langmuir film of NPs by controlling parameters such as the concentration of NPs in a nanoparticle solution system (liquid+NPs), the volume of nanoparticle solution to be dispersed across the surface of a sub-phase, the sub-phase temperature and pH, and the final area over which the solution can spread across the sub-phase.

Unlike previous methods to create well-ordered Langmuir films of NPs, the present method does not require mechanical compression of the floating NPs at the surface of the sub-phase to form a well-ordered film after the initial deposition of the Langmuir film to obtain a well-structured, contiguous monolayer. Instead, the spreading nanoparticle solution is constrained to spreading only within a limited area after deposition onto the sub-phase surface, thus ceasing the complete spreading of the Langmuir film and "locking" the NPs into a spontaneous, self-assembled monolayer. This monolayer Langmuir film of NPs can be generated to have a homogenous and uniform structure across its final deposited surface area, without patches or "islands" of NPs. Additionally, this monolayer Langmuir film is homogenous and well-defined in thickness across its entire deposition area.

Following the formation of this well-structured, nanoparticle monolayer film on the surface of the sub-phase, a substrate may be put in contact with the nanoparticle monolayer using LB or LS techniques. After coating, the substrate retains a well-ordered nanoparticle coating of a defined thickness. Multiple, homogenous layers of NPs may be coated on a substrate by subsequent contact events of the coated substrate with well-structured nanoparticle monolayers on the surface of a sub-phase.

As used herein, "well-ordered" refers to the organization and uniformity of nanoparticle films or coatings at macro and micro-scales. At a macro-scale, a "well-ordered" nanoparticle film is substantially uniform across the entire coated surface of the substrate and comprises a nanoparticle layer of a defined, consistent thickness across the entire coated surface. Examples of non-uniform coatings at the macro-scale include those with patchy coverage, holes in the layer, or inconsistent thickness levels when viewed across the entire area of the coating. At a micro-scale, a "well-ordered" nanoparticle film is substantially uniform relative to the dimensions of a nanoparticle, with substantially even spacing between NPs, consistent organization of NPs, and with a generally homogenous film thickness. Examples of non-uniform coatings at the micro-scale include those with instances of two dimensional grain boundaries in otherwise crystalline-like ordering, those with highly amorphous or fractal patterns in their nano-structure, or those having three-dimensional agglomerates rather than retaining a two dimensional monolayer when viewed across the range of how the structures in the film repeat themselves at the nano-scale.

As used herein, a "monolayer" is a layer that has a defined thickness of only one molecule of the material. A nanoparticle monolayer is correspondingly a layer of NPs with a consistent, homogenous thickness of only one nanoparticle. The term monolayer by itself will be used interchangeably to mean a nanoparticle monolayer.

Figure 1:
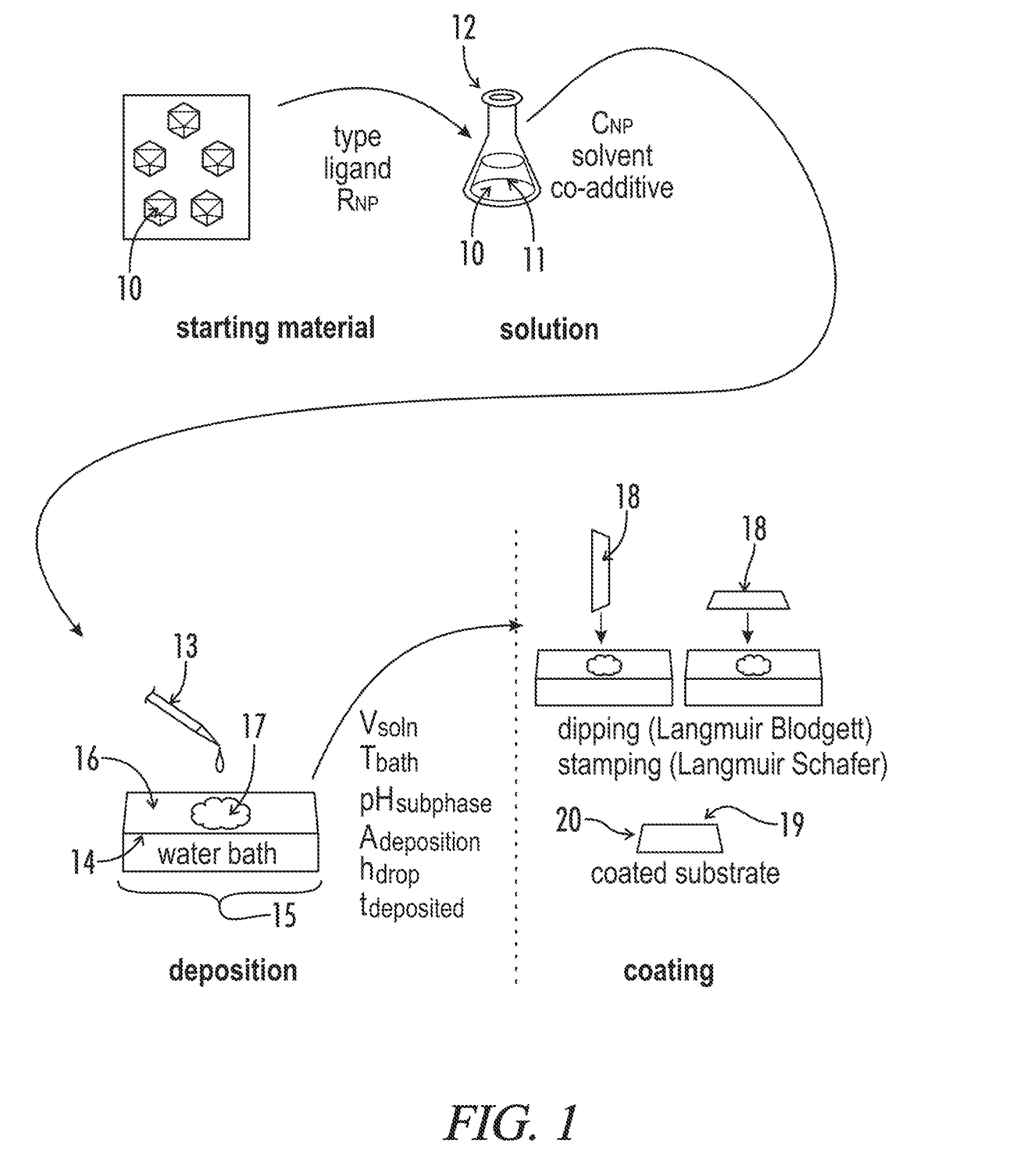
FIG. 1 is an illustration of the various factors involved in methods for preparing Langmuir films of NPs on the surface of a sub-phase and the subsequent coating of a substrate to form a Langmuir-Schaefer or Langmuir-Blodgett film of the NPs.

FIG. 1 depicts the parameters that can be defined or controlled during any method, including exemplary methods, to try to create an initial well-ordered nanoparticle monolayer 17 on a sub-phase 14 and transfer the nanoparticle monolayer 17 to a substrate 18. The nanoparticle solution 12 may optionally further comprise one or more co-additives 9. Co-additives 9 may optionally be included in the nanoparticle solution 12 to alter the desired properties of a resulting nanoparticle coating or the spreading behavior of the NPs 10 during and after deposition as a Langmuir film.

Nanoparticles 10 may be of a predetermined material type or composition, with a predetermined shape such as a sphere, cube, or cylinder, with a radius ($R_{NP}$) or other characteristic size parameter, and with or without a ligand coating. In one embodiment, the NPs 10 of the method may be QDs. In this embodiment, the size (radius $R_{NP}$) and type or composition of the quantum dot determines its optoelectrical properties. The $R_{NP}$ may range from approximately 1 nm to approximately 100 nm in at least one dimension of the NPs 10. A ligand coating may comprise any material compatible with the intended solvent 11 of the nanoparticle solution, compatible with the intended sub-phase 14, compatible with the nanoparticle material, shape, and surface charge, and suitable for use in the intended application of the coated substrate 20. Typical ligand coatings for NPs 10 include carboxylates, phosphonates, thiolates, amines, phosphines, metal complexes, halide ions, chalcogenide ions, cationic counter ions, imidazoles, and pyridines. Ligand coatings may be homogenous or heterogeneous as desired and suitable for use in the intended application. In the instance where the NPs 10 are semi-conductor quantum dots, an organic ligand may be used to prevent oxidation and preserve the optoelectrical behavior imparted by the quantum dot. In a preferred embodiment, the NPs 10 are QDs and comprise a gradient core with oleic acid and an $R_{NP}$ of approximately 3 nm to approximately 4 nm. In this preferred embodiment, the material type or composition of the quantum dot may be varied to alter the optoelectrical properties.

In one embodiment, one type of nanoparticle 10 is utilized in the nanoparticle solution 12. In another embodiment, more than one type of nanoparticle 10 is used in the nanoparticle solution 12. In some embodiments, NPs 10 of more than one size (radius, $R_{NP}$) are used in the nanoparticle solution 12. In some embodiments, the NPs 10 are the same size (radius, $R_{NP}$). In other embodiments, NPs 10 of different shapes are used in nanoparticle solution 12. In one embodiment, the NPs 10 have no coating ligand. In another embodiment, the NPs 10 have more than one coating ligand. In yet another embodiment, the NPs 10 have one coating ligand.

Solvents 11 may comprise liquids which are compatible with the NPs 10 and any ligand on their surface. Solvents 11 may also be selected based on their ability to spread on the surface of the sub-phase 14, their viscosities, their effect on the charge or agglomeration of the NPs 10, and their rate of evaporation. Examples of solvents 11 include ethanol, acetone, isopropanol, hexane, chloroform, toluene, cyclopentanone, dichloromethane, and n-methyl-2-pyrrolidone. In one embodiment, the solvent 11 may be toluene.

The concentration of NPs 10 in the solvent 11 and the volume of nanoparticle solution ($V_{soln}$) 13 used to form a nanoparticle film are parameters that influence the uniformity and organization of the nanoparticle film. Methods of determining an ideal concentration of NPs ($C_{NP}$) and $V_{soln}$ 13 are described below. In general, $C_{NP}$ may be calculated for a given $V_{soln}$ 13 as the number of NPs 10 needed to form a monolayer film when spread across a predetermined area, per that $V_{soln}$ 13 which spreads across the predetermined area.

Figure 2A:
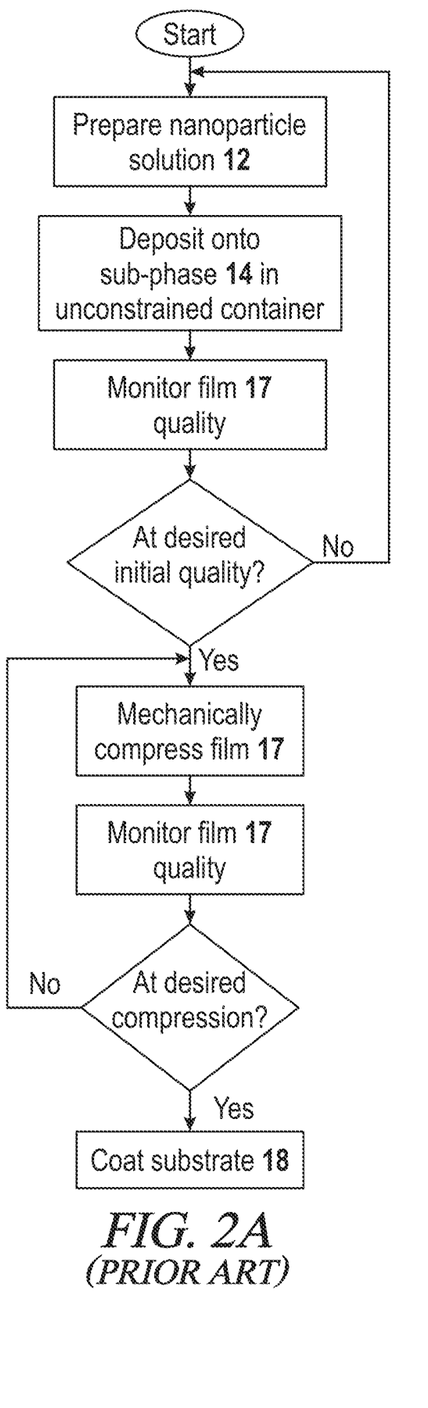
FIG. 2A-B are flowcharts demonstrating the difference between existing methods and an exemplary method to create well-structured, monolayer Langmuir films of NPs following the processes in FIG. 1.
Figure 2B:
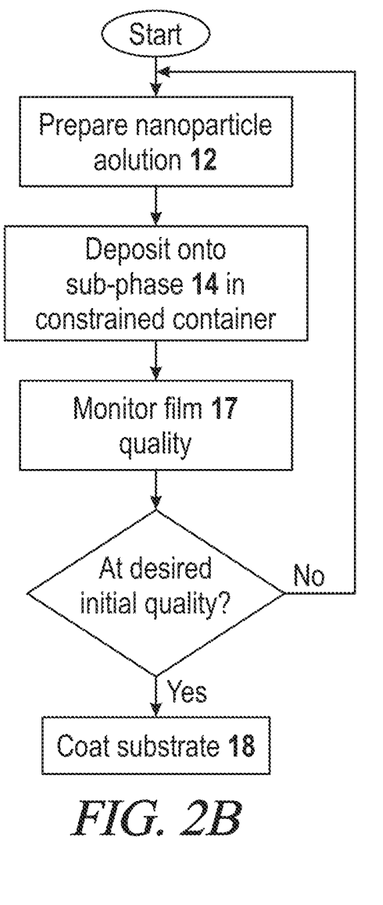

As shown in FIG. 1 and described in the methods in FIG. 2A-B, a $V_{soln}$ 13 with a concentration $C_{NP}$ is deposited on the top surface 16 of a liquid sub-phase 14. The sub-phase 14 may be any liquid that is compatible with the solvent 11 and nanoparticle solution 12 and that allows the $V_{soln}$ 13 to float on its top surface 16 as a nanoparticle film. In one embodiment, the sub-phase 14 is water. As detailed in FIG. 2A-B, both prior art and disclosed methods involve depositing $V_{soln}$ 13 on the top surface 16 of the sub-phase 14. However, FIG. 2A highlights the compression and evaluation loop steps of prior art unconstrained deposition methods, which are eliminated in disclosed methods shown in FIG. 2B. In the disclosed methods, the sub-phase 14 may be stored within a vessel 15 that comprises a base with closed walls and access to a top surface 16 of the sub-phase 14. The vessel 15 may hold sub-phase 14 in a static state with no liquid flow or in a dynamic state, such as flowing sub-phase 14 through channels of a fluidic device. The sub-phase 14 may have parameters of pH ($pH_{subphase}$) and temperature ($T_{bath}$) which each may be varied to effect nanoparticle film spreading and organization as detailed below. The $V_{soln}$ 13 may be deposited on a top surface 16 of the sub-phase 14 using a dropper, a pipette, a syringe, or any other suitable liquid dropping means. The deposition 16 of $V_{soln}$ 13 may be undertaken by contacting the $V_{soln}$ 13 directly with the top surface 16 of the subphase 14 using a touch method or by dropping $V_{soln}$ 13 from a height ($h_{drop}$) above the top surface 16. In one embodiment, $V_{soln}$ 13 is deposited by the touch method and in another by the drop or fall method. The deposition may take place in a way that allows the $V_{soln}$ 13 to spread unconstrained across the subphase 14 so that $A_{deposition}$ is effectively infinity. Alternatively, in the disclosed methods, the deposition takes place in such a way that the liquid solution $V_{soln}$ 13 is limited to spread only to a finite area $A_{deposition}$. In a dynamic flowing sub-phase 14 situation, $V_{soln}$ 13 may be included in the channels as layers that are immiscible with sub-phase 14, droplets that are immiscible with sub-phase 14, or introduced through channels that combine with sub-phase 14 within the fluidic device. The effects of deposition methods on nanoparticle monolayer film 17 organization and uniformity are described below.

Figure 3:
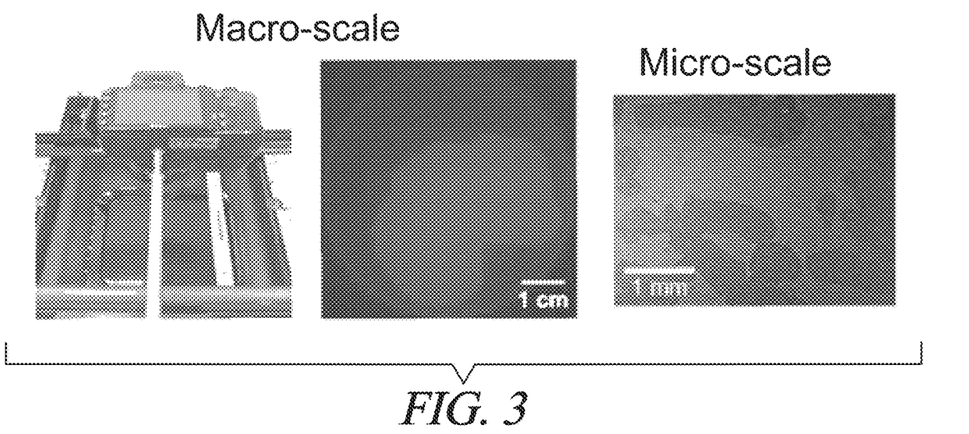
FIG. 3 shows the macro-scale and micro-scale analysis of the nanoparticle Langmuir monolayers of FIG. 1.

Methods of assessing the uniformity and organization of nanoparticle films at a macro- and micro-scale are shown in FIG. 3. The macro-scale features may be characterized using techniques such as fluorescence microscopy or other fluorescence imaging techniques. Optical imaging techniques and other macro-scale analysis may be undertaken as suitable. Techniques for micro-scale analysis of nanoparticle films include scanning electron microscopy, ellipsometry, atomic force microscopy, Brewster angle microscopy, confocal microscopy, and any other technique suitable for analyzing nano- and micro-scale film features. In FIG. 3, the macro-scale imaging is undertaken using fluorescence imaging and the micro-scale imaging is undertaken using Brewster angle microscopy.

Figure 4:
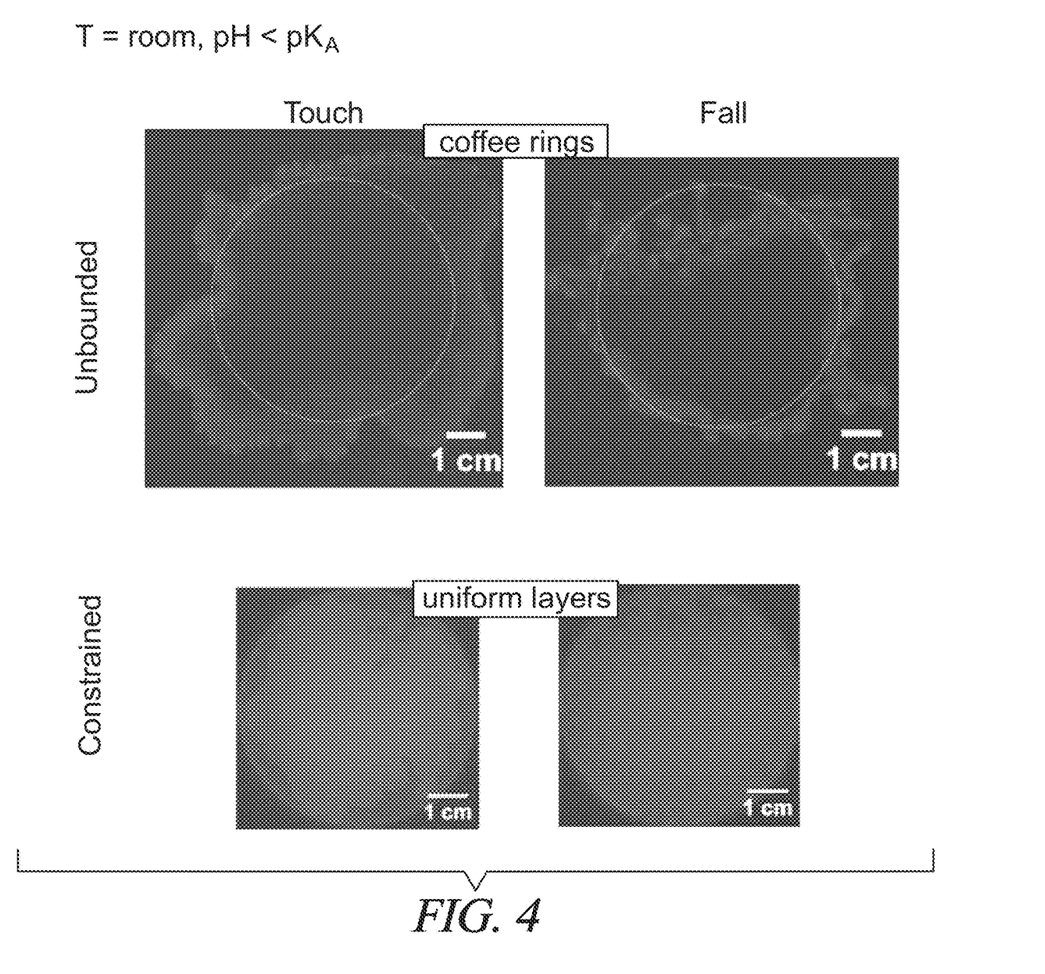
FIG. 4 depicts typical and exemplary results of nanoparticle solution deposition methods and deposition areas, as shown in FIG. 1, on nanoparticle film organization and uniformity.
Figure 5:
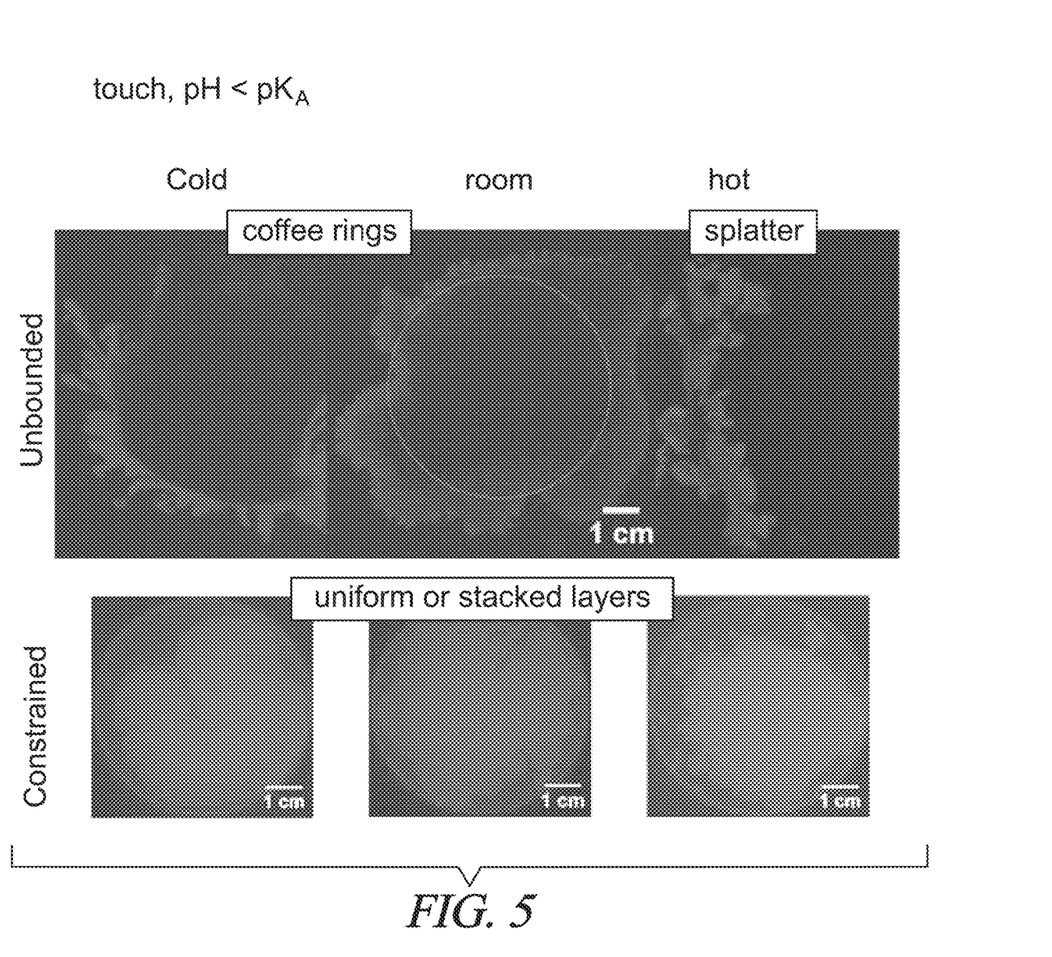
FIG. 5 depicts typical and exemplary results of sub-phase temperature and nanoparticle solution deposition areas, as shown in FIG. 1, on nanoparticle film organization and uniformity.

For spherical NPs 10, the ideal area of constrained deposition $A^*_{deposition}$ is calculated using the formula for hexagonal close packing of spheres as $A^*_{deposition} = 4\,C_{NP}\,V_{soln}\,R_{NP}^2\,\sin(60°)$. A step in estimating the ideal deposition area $A^*_{deposition}$ is depositing an initial $V_{soln}$ 13 of an initial concentration $C_{NP}$ on the top surface 16 of a sub-phase 14 with an unbounded area for the resulting solution to spread. If agglomerates of NPs 10 are formed, the $C_{NP}$ is potentially too high or the solution volume $V_{soln}$ is too low and the nanoparticle solution 12 should be reformulated. If no agglomerates are formed, the spreading nanoparticle film should be monitored to observe the point in which the film forms a "coffee ring" pattern. A "coffee ring" pattern is shown in FIGS. 4-5 and occurs when nanoparticle solution spreads to accumulate at edges with no or substantially no nanoparticle material in the center. Without being beholden to any one theory, it is believed that spreading forces dominate other forces felt by the nanoparticle film, such as capillary forces that draw the NPs 10 together as solvent 11 evaporates and attractive forces between the NPs 10. When a "coffee ring" patterned film is first observed, the area within the "coffee ring" boundaries is measured. This area is assigned to be the approximate area of constrained deposition ($A_{deposition}$) to be used for that $V_{soln}$ 13 and $C_{NP}$. In the instance where the ideal $A^*_{deposition}$ or approximate $A_{deposition}$ are is not large enough for the intended substrate 18 to be coated, a larger factor of $C_{NP} \times V_{soln}$ 13 may be used and the "coffee ring" step should be re-analyzed as needed.

It should be noted that when $V_{soln}$ 13 is too large, material may be unnecessarily wasted and when $V_{soln}$ 13 is too low, $A_{deposition}$ may not accommodate the intended substrate or the nanoparticle solution 12 may continue to spread beyond a point where the nanoparticle film is uniform and free of defects or holes.

In previous reported methods of Langmuir nanoparticle film formation, $A_{deposition}$ was unconstrained or unbounded. In these previous cases, $A_{deposition}$ was considered to be infinite. In the present methods, as described by example in FIG. 2B, $A_{deposition}$ is to be constrained based on the ideal value or on the area at which a nanoparticle solution 12 of a given $V_{soln}$ 13 and $C_{NP}$ would otherwise form a "coffee ring" pattern. The constraint of the spreading of the nanoparticle solution may be in the form of a wall of the vessel 15 or by application of an interior boundary. Any suitable wall, partition, or boundary such that a spreading nanoparticle solution 12 may be contained within $A_{deposition}$ is contemplated. In the exemplary methods, a constrained area for deposition of the Langmuir film of NPs was created by the circular wall of the container for the sub-phase 14.

The time needed for the nanoparticle solution 12 to spread and then stabilize into a nanoparticle monolayer film 17 $t_{deposited}$. The time is controlled by the rate of spreading of nanoparticle solution 12, which in turn is controlled in one theory by the interfacial tensions of liquids 11 and 14 as well as the viscosity and density of sub-phase liquid 14. Without being beholden to any one theory, the $t_{deposited}$ may be determined such that the spreading of the nanoparticle solution 12 ceases at a time necessary to "lock" the nanoparticle film into a nanoparticle monolayer 17 that is uniform, homogeneous, well-ordered, and free of defects. The forces that occur as the nanoparticle solution 12 spreads may serve to pull the NPs 10 apart and may be influenced by the viscosity of the solvent 11, the contact angle of the solvent 11 upon the top surface 16 of the sub-phase 14, and the inclusion of certain co-additives 9 in the nanoparticle solution. A force that pulls the NPs 10 together may comprise the attractive forces between the NPs 10 and may be influenced by the presence of ligands on the NPs 10. Capillary forces may serve to draw the NPs 10 together as the solvent 11 evaporates. The evaporation rate of the solvent 11 that drives the capillary forces may be adjusted by controlling parameters including the $T_{bath}$, ambient temperature, humidity, and other environmental factors. Evaporation of the solvent 11 may be controlled using structures or containers such as an incubator or other suitable humidity and/or temperature controlling containers. At $t_{deposited}$, it is believed that the suppression of the spreading forces allows a balance with evaporation-led capillary forces and intraparticle attractive forces and that a well-ordered nanoparticle monolayer 17 may be "locked" as the film stabilizes and the solvent evaporates. Thus, this "locking" moment occurs as the NPs 10 spontaneously self-assemble into a nanoparticle monolayer 17. The constraint of the spreading area does not involve post-compression of the nanoparticle Langmuir film and, because the assembly and organization of NPs 10 are driven by a balance of non-external forces, the assembly is defined to be spontaneous.

FIGS. 4 and 5 illustrate the effects of unbounded and constrained deposition of nanoparticle solution 12 on a sub-phase 14. With variation of other parameters, such as $h_{drop}$ and $T_{bath}$, unbounded deposition of nanoparticle solution 12 is observed to result in "coffee rings", while constrained deposition of nanoparticle solution 12 may result in a nanoparticle monolayer 17 that is uniform and well-ordered. In FIG. 4, $h_{drop}$ is shown to have minimal or substantially no influence on the formation of nanoparticle monolayers 17 in both constrained deposition and unbounded deposition conditions. Similarly, in FIG. 5 $T_{bath}$ variation changed the macro structure of the film in unconstrained deposition but did not appear to influence the structure during constrained formation of nanoparticle monolayers 17, resulting in layers that were uniform and well-ordered regardless of sub-phase 14 temperature, $T_{bath}$.

In one embodiment of the disclosure, $V_{soln}$ 13 is deposited directly on the top surface 16 of a sub-phase to form a nanoparticle monolayer 17. In one embodiment, $V_{soln}$ 13 is deposited from $h_{drop}$ above a top surface 16 of a sub-phase 14 to form a nanoparticle monolayer 17. The $h_{drop}$ may be approximately 0 cm to approximately 25 cm or any height above the top surface 16 of a sub-phase 14 such that a nanoparticle monolayer 17 may be formed.

In one embodiment of the disclosure, $T_{bath}$ may be approximately 5° C. to approximately 75° C. or any temperature such that a nanoparticle monolayer 17 may be formed on the top surface 16 of the sub-phase 14. In one embodiment, $T_{bath}$ may be room temperature.

Figure 6:
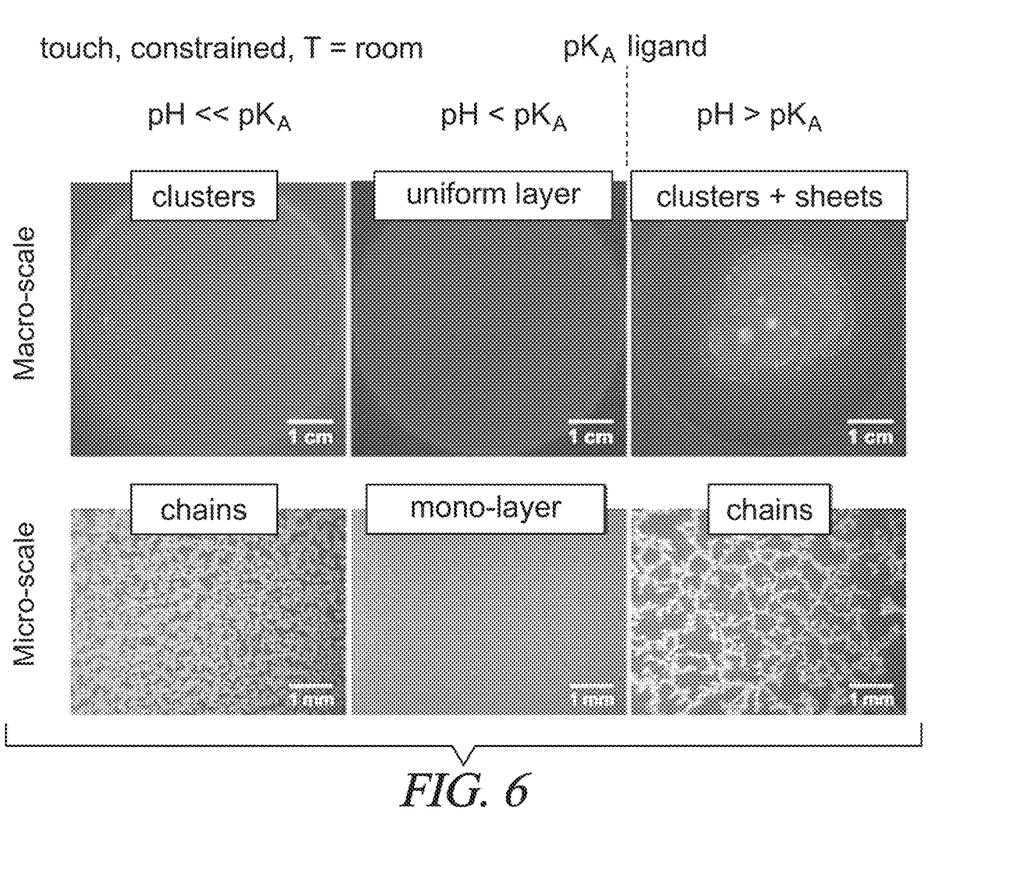
FIG. 6 depicts exemplary results of sub-phase pH, as shown in FIG. 1, on nanoparticle film organization and uniformity.

As shown in FIG. 6, the $pH_{subphase}$ influences the formation of uniform and well-ordered nanoparticle monolayers 17. At a $pH_{subphase}$ that is greater than the pKa (−log of the acid dissociation constant) of ligands coated on the NPs 10, nanoparticle monolayers 17 were not observed. Instead, clusters and sheets of NPs 10 were observed at the macro-scale and chains of NPs 10 were observed at the micro-scale. Without being beholden to any one theory, it is believed that at a $pH_{subphase}$ that is greater than the pKa of ligands coated on the NPs 10, the ligand may be dissociated and the NPs 10 may be charged, thus altering the attractive forces between the NPs 10. At a $pH_{subphase}$ that is less than the pKa of ligands coated on the NPs 10, clusters of NPs 10 were observed at the macro-scale and chains of NPs 10 were observed at the micro-scale. Without being beholden to any one theory, it is believed that components of the sub-phase 14 may interact with the ligands coated on the NPs 10, and cause additional interaction forces and may allow attraction forces of the NPs 10 to dominate the force balance on the spreading nanoparticle solution 12. At a $pH_{subphase}$ that is slightly less than the pKa of ligands coated on the NPs 10, a uniform layer of NPs 10 was observed at the macro-scale and a nanoparticle monolayer 17 was observed at the micro-scale. Without being beholden to any one theory, it is believed that at such a pH the ligands that coat the NPs 10 are neutral and that NPs 10 do not undergo additional forces from charge repulsion. In a preferred embodiment, the $pH_{subphase}$ that is slightly less than the pKa of ligands coated on the NPs 10.

As shown in FIG. 1 and detailed in FIG. 2B, a substrate 18 may be placed in contact with a well-organized and uniform nanoparticle monolayer 17 to form a well-ordered nanoparticle coating 19 on the surface of the substrate 18. The substrate 18 may be any material suitable for coating with a nanoparticle coating and may be of any size and shape compatible with the dimensions of the sub-phase vessel 15 and the $A_{deposition}$. The vessel 15 containing the nanoparticle monolayer 17 may be selected to accommodate the dimensions of an intended substrate 18. The coated substrate 20 may be produced using LB or LS techniques. In the case of LB methods, the substrate 18 is immersed in the sub-phase 14 in an orientation where the smallest dimension of the substrate 18 is parallel with the top surface 16 of the sub-phase 14. After the portion of the substrate to be coated has been immersed in the sub-phase 14, it is withdrawn in the same orientation in which it was immersed, allowing a well-ordered coating of NPs 19 to be coated on the substrate 18. In the case of LS methods, the substrate 18 is stamped onto the nanoparticle monolayer 17 on the top surface 16 of the sub-phase 14, where the substrate 18 is in an orientation where the smallest dimension of the substrate is perpendicular to the top surface 16 of the sub-phase 14.

The outcome of the combination of constrained spontaneous self-assembly of a nanoparticle monolayer 17 and LB or LS coating techniques may be a substrate 18 that is coated with a well-ordered nanoparticle coating 19.

These methods may be used to produce coated substrates 18 with well-ordered monolayer coatings 19 or may be utilized repeatedly to form coated substrates with well-defined multilayers. The thickness of the coated nanoparticle layer or layers may be homogeneous and uniform. The methods may be integrated as a batch process wherein the sub-phase 14 is static under a nanoparticle solution as it is deposited as a drop, multiple drops, or a stream onto the sub-phase 14 and wherein the deposited solution is limited to spread on the sub-phase 14 only within a constrained area. The methods may also be integrated as a continuous process wherein the sub-phase 14 flows under the point of deposition of a nanoparticle solution while it is deposited as a drop, multiple drops, or a stream onto the sub-phase 14 and wherein the deposited solution is limited to spread on the sub-phase 14 only within a constrained region. Either of these methods may be compatible in a production line approach to manufacture and coat substrates at an industrial scale.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

We claim:

1. A method of preparing a well-ordered nanoparticle coating on a substrate, comprising the steps of:
   providing a nanoparticle solution, the nanoparticle solution comprising nanoparticles in a solvent;
   containing a sub-phase of a denser, immiscible liquid within a vessel;
   depositing a volume of said nanoparticle solution onto a top surface of the liquid sub-phase;
   providing a constrained area on the top surface of the sub-phase where nanoparticle solution spreading is physically limited, such that the nanoparticles spontaneously form a uniformly ordered monolayer on the sub-phase within the constrained area during the spreading phase; and
   contacting the substrate with said nanoparticle monolayer such that the substrate is coated with the well-ordered nanoparticle coating; wherein the nanoparticles are quantum dots.

2. The method of claim 1, wherein the quantum dots comprise a gradient core with oleic acid.

3. The method of claim 1, wherein the nanoparticles have a radius of 3 nm to 4 nm.

4. The method of claim 1, wherein the nanoparticles are coated with ligands.

5. The method of claim 1, wherein the solvent is toluene.

6. The method of claim 1, wherein the sub-phase is water.

7. The method of claim 4, wherein a pH of the sub-phase is less than a pKa of ligands coated on the nanoparticles.

8. The method of claim 1, wherein the sub-phase is contained in a static state.

9. The method of claim 8, wherein the depositing of the volume of nanoparticle solution on the top surface occurs by contacting the volume of nanoparticle solution directly with the top surface.

10. The method of claim 8, wherein the depositing of the volume of nanoparticle solution on the top surface occurs by dropping the volume of nanoparticle solution from a height above the top surface.

11. The method of claim 1, wherein the sub-phase is contained within a channel in a flowing state.

12. The method of claim 11, wherein the depositing of the volume of nanoparticle solution on the top surface occurs by including the volume of nanoparticle solution in the channels as layers or droplets that are immiscible with the sub-phase.

13. The method of claim 1, wherein the substrate is contacted with the nanoparticle monolayer using a Langmuir Blodgett technique.

14. The method of claim 1, wherein the substrate is contacted with the nanoparticle monolayer using a Langmuir Schaefer technique.

15. A method of preparing a well-ordered nanoparticle coating on a substrate, comprising the steps of:
   a) providing a nanoparticle solution comprising an initial concentration of nanoparticles in a solvent;
   b) containing a sub-phase of a denser, immiscible liquid within a vessel;
   c) depositing a volume of said nanoparticle solution onto the top surface of the liquid sub-phase such that a nanoparticle film is formed;
   d) evaluating the nanoparticle film for the formation of agglomerates;
   e) repeating steps a)-d) when agglomerates are observed, such that the initial concentration of nanoparticles in the solvent is decreased in step a);
   f) monitoring the nanoparticle film for formation of a coffee ring pattern;
   g) measuring an initial coffee ring pattern area if the coffee ring pattern begins to form;
   h) repeating steps a)-g) while providing to the top surface of the sub-phase a constrained area based on the measured initial coffee ring pattern area, where the spreading of nanoparticle solution is physically limited by the constrained area, such that the nanoparticles spontaneously form a uniformly ordered monolayer on the sub-phase within the constrained area during the spreading phase; and
   i) contacting the substrate with said nanoparticle monolayer such that the substrate is coated with a well-ordered nanoparticle coating.

16. The method of claim 15, wherein the nanoparticles are quantum dots.

17. The method of claim 15, wherein the nanoparticles are coated with ligands and wherein a pH of the sub-phase is slightly less than a pKa of the ligands coated on the nanoparticles.

18. A method of preparing a well-ordered nanoparticle coating on a substrate, comprising the steps of:
   providing a nanoparticle solution, the nanoparticle solution comprising nanoparticles in a solvent;
   containing a sub-phase of a denser, immiscible liquid within a vessel;
   depositing a volume of said nanoparticle solution onto a top surface of the liquid sub-phase;
   providing a constrained area on the top surface of the sub-phase, wherein spreading forces of the nanoparticle solution are balanced by capillary forces that draw nanoparticles together as the solvent evaporates, such that the volume of nanoparticle solution disperses spontaneously across the area to form a uniform nanoparticle monolayer across the constrained area; and
   contacting the substrate with said nanoparticle monolayer such that the substrate is coated with a well-ordered nanoparticle coating; wherein the nanoparticles are quantum dots.

19. The method of claim 18, wherein the nanoparticles are coated with ligands and wherein a pH of the sub-phase is less than a pKa of the ligands coated on the nanoparticles.

* * * * *